United States Patent
Kushnir

(10) Patent No.: US 8,861,407 B2
(45) Date of Patent: Oct. 14, 2014

(54) MULTIPLE CONNECTION OPTIONS FOR A TRANSCEIVER

(75) Inventor: Igal (Yehuda) Kushnir, Azur (IL)

(73) Assignee: Provigent Ltd., Herzliya (IL)

( * ) Notice: Subject to any disclaimer, the term of this patent is extended or adjusted under 35 U.S.C. 154(b) by 260 days.

(21) Appl. No.: 13/177,574

(22) Filed: Jul. 7, 2011

(65) Prior Publication Data

US 2013/0010654 A1    Jan. 10, 2013

(51) Int. Cl.
  *H04B 7/00*    (2006.01)
  *H01P 1/213*   (2006.01)
(52) U.S. Cl.
  CPC .................................. *H01P 1/213* (2013.01);
                    *H01L 2924/19107* (2013.01)
  USPC ....................................................... 370/277
(58) Field of Classification Search
  USPC .................................................. 370/349, 277
  See application file for complete search history.

(56) References Cited

U.S. PATENT DOCUMENTS

| | | | |
|---|---|---|---|
| 5,544,222 A | 8/1996 | Robinson et al. | |
| 5,550,813 A | 8/1996 | Vella-Coleiro | |
| 5,603,098 A * | 2/1997 | Kwan | 455/83 |
| 5,915,212 A * | 6/1999 | Przelomiec et al. | 455/83 |
| 5,933,788 A | 8/1999 | Faerber et al. | |
| 5,937,336 A * | 8/1999 | Kumagai | 455/126 |
| 6,198,451 B1 | 3/2001 | Aylward et al. | |
| 6,420,944 B1 * | 7/2002 | Costa et al. | 333/137 |
| 6,456,610 B1 * | 9/2002 | Briley | 370/337 |
| 6,982,879 B1 | 1/2006 | Franca-Neto et al. | |
| 7,706,835 B2 * | 4/2010 | Kanazawa | 455/552.1 |
| 8,067,998 B2 * | 11/2011 | McKay et al. | 333/26 |
| 2002/0183013 A1 | 12/2002 | Auckland et al. | |
| 2003/0085836 A1 | 5/2003 | Mikami et al. | |
| 2003/0231081 A1 * | 12/2003 | Yonekura et al. | 333/134 |
| 2004/0018819 A1 * | 1/2004 | Coan | 455/83 |
| 2006/0160505 A1 | 7/2006 | Ichitsubo et al. | |
| 2006/0192631 A1 * | 8/2006 | Kearns | 333/126 |
| 2006/0246850 A1 * | 11/2006 | Onoda | 455/78 |
| 2007/0115076 A1 * | 5/2007 | Khazanov | 333/105 |
| 2008/0242240 A1 | 10/2008 | Rofougaran et al. | |
| 2009/0017774 A1 | 1/2009 | Shen et al. | |
| 2009/0072379 A1 * | 3/2009 | Ewe et al. | 257/700 |
| 2009/0170452 A1 | 7/2009 | Rubin | |
| 2010/0103060 A1 * | 4/2010 | Au | 343/720 |
| 2010/0238849 A1 | 9/2010 | Klein | |

(Continued)

FOREIGN PATENT DOCUMENTS

WO    2005034376 A1    4/2005

OTHER PUBLICATIONS

International Application PCT/IB2010/050012 Search Report dated Jun. 10, 2010.

(Continued)

*Primary Examiner* — Brandon Renner
*Assistant Examiner* — Faisal Choudhury
(74) *Attorney, Agent, or Firm* — Sterne, Kessler, Goldstein & Fox P.L.L.C.

(57) ABSTRACT

Apparatus, including a communication device which has two or more radio frequency (RF) ports for communicating in respective frequency bands. The apparatus also includes a substrate which has two or more interconnection ports, and which are respectively connected to the two or more RF ports of the communication device and are configured to couple a selected one of the RF ports to a duplexer operating at one of the respective frequency bands.

30 Claims, 8 Drawing Sheets

(56) References Cited

U.S. PATENT DOCUMENTS

| | | | |
|---|---|---|---|
| 2011/0028091 A1* | 2/2011 | Higgins et al. | 455/41.2 |
| 2011/0175789 A1* | 7/2011 | Lee et al. | 343/853 |
| 2011/0235553 A1* | 9/2011 | Andersson et al. | 370/277 |
| 2012/0007679 A1* | 1/2012 | Burgener et al. | 330/277 |
| 2012/0286984 A1* | 11/2012 | Schimper et al. | 341/144 |

OTHER PUBLICATIONS

Wikipedia, the free encyclopedia, "*Circulator*," 3 pages, http://en.wikipedia.org/wiki/Circulator.

* cited by examiner

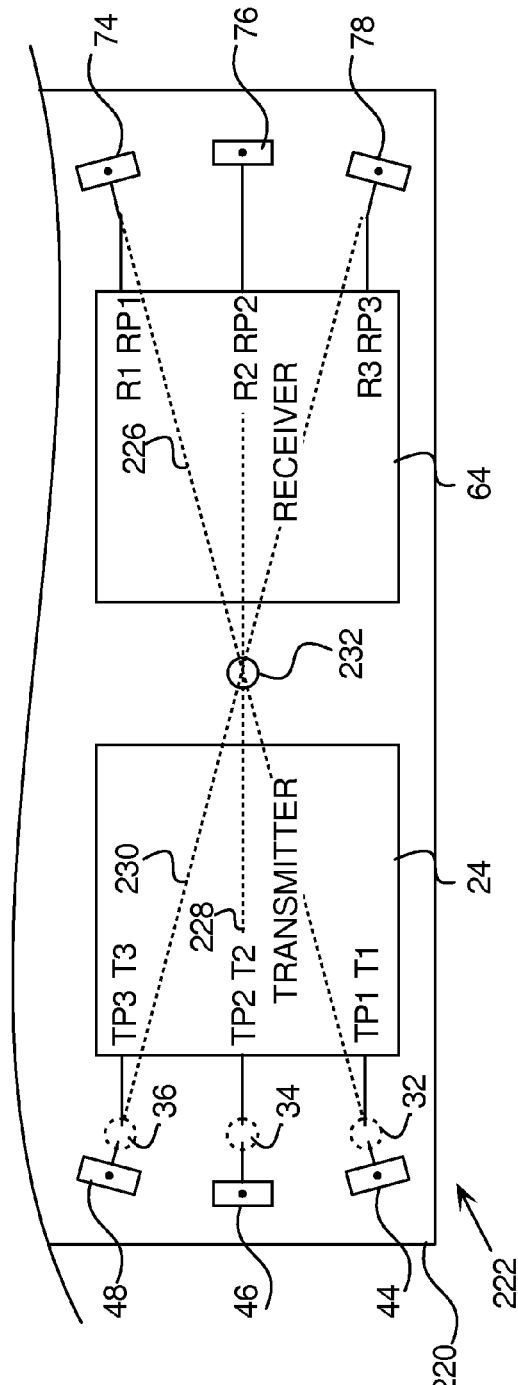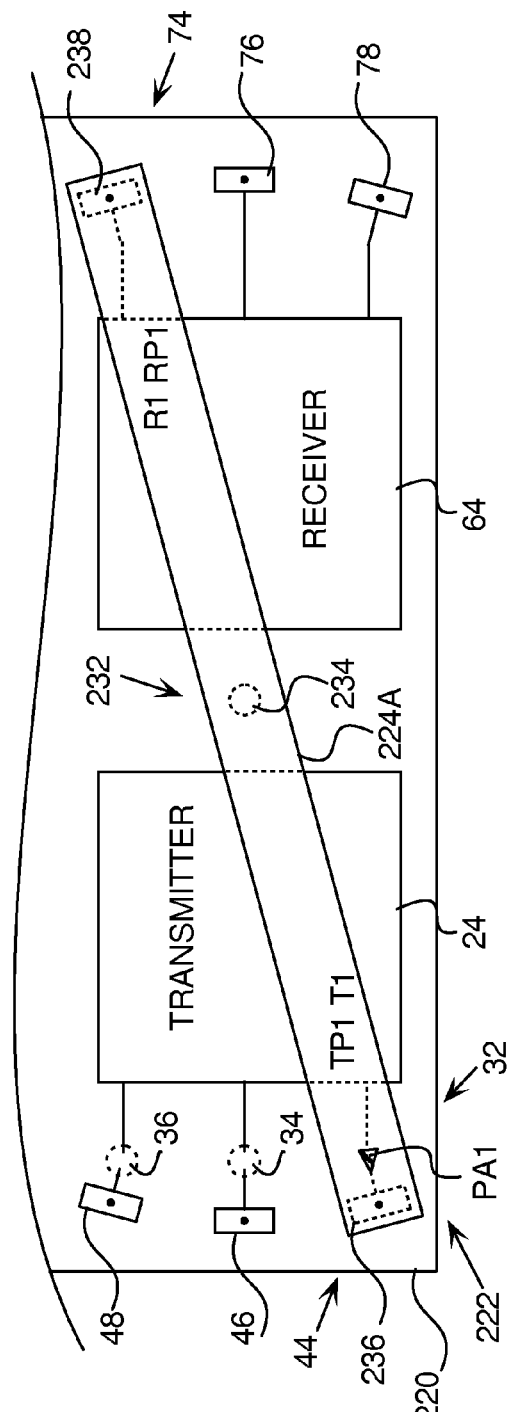
FIG. 5
FIG. 6

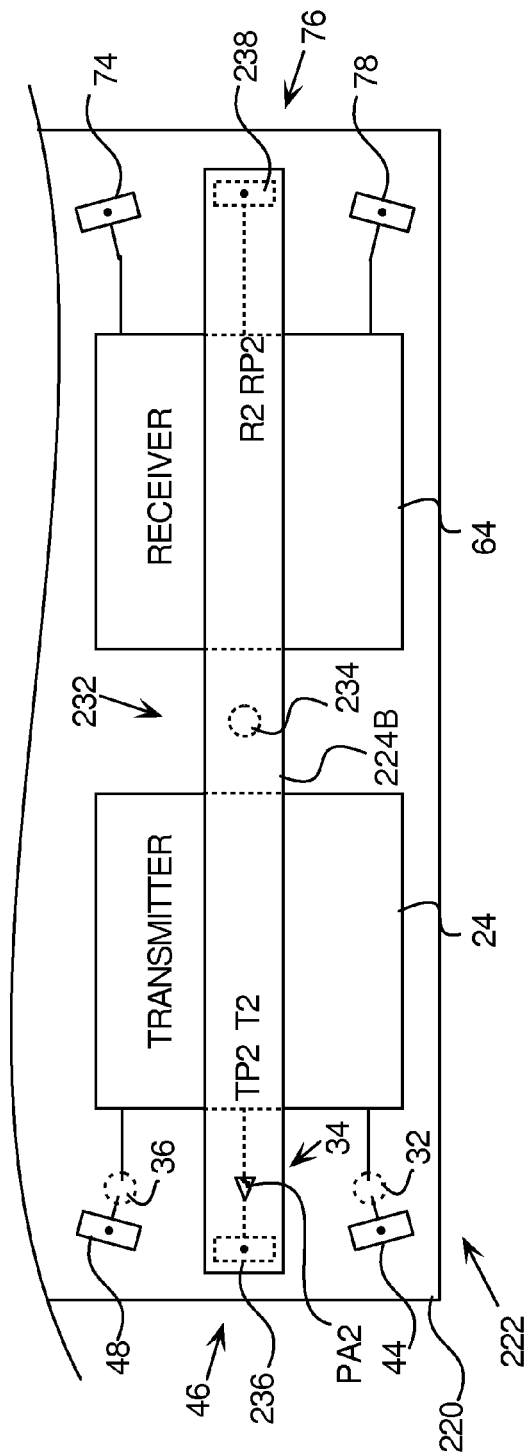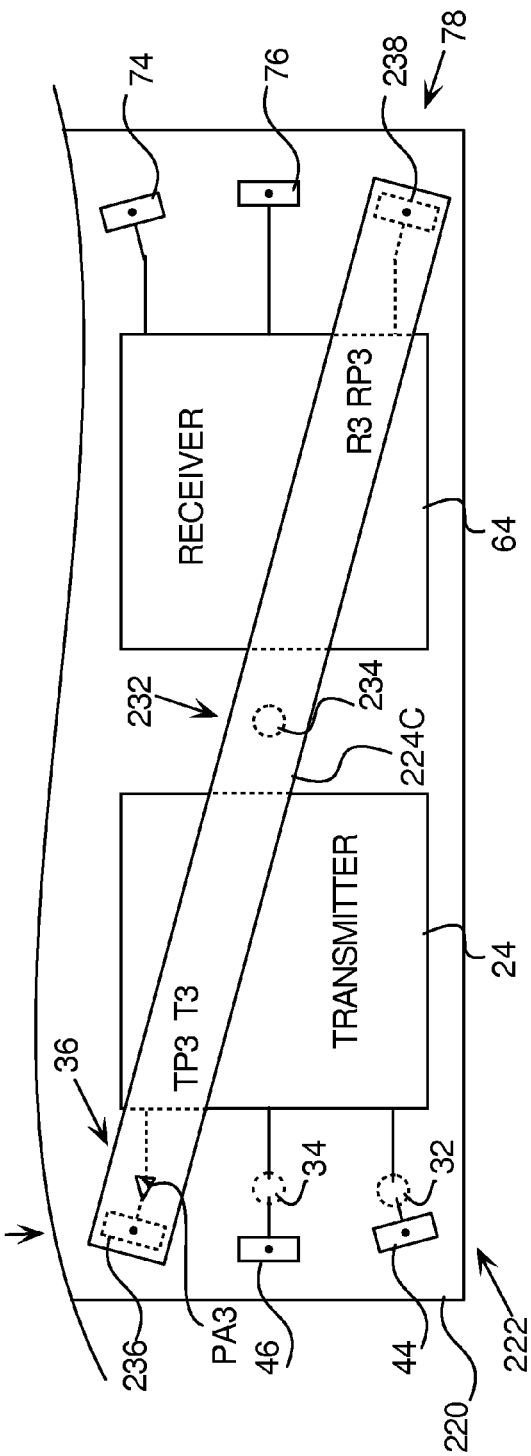

US 8,861,407 B2

MULTIPLE CONNECTION OPTIONS FOR A TRANSCEIVER

FIELD OF THE INVENTION

The present invention relates generally to transceivers, and specifically to differing ways for connecting microwave transceivers.

BACKGROUND OF THE INVENTION

Microwave transceivers typically operate over a range of frequencies. In some cases, different transceivers may be required depending on the receive or transmit frequency, or frequency band, at which the transceivers are to operate. Such a requirement for different transceivers uses resources inefficiently.

The description above is presented as a general overview of related art in this field and should not be construed as an admission that any of the information it contains constitutes prior art against the present patent application.

The present invention will be more fully understood from the following detailed description of the embodiments thereof, taken together with the drawings in which:

BRIEF DESCRIPTION OF THE DRAWINGS

FIGS. 5, 6, 7, 8 are schematic top views of portions of a substrate, according to alternative embodiments of the present invention;

DETAILED DESCRIPTION OF EMBODIMENTS

Overview

Figure 1:
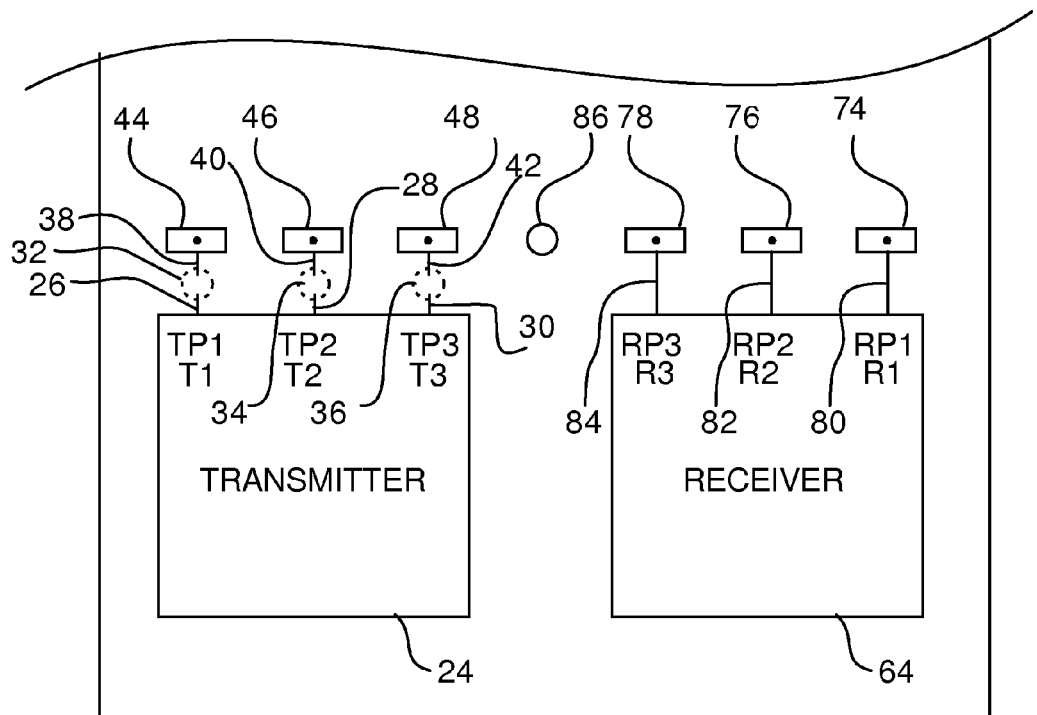
FIGS. 1, 2, 3, 4 are schematic top views of portions of a substrate, according to embodiments of the present invention.

In an embodiment of the present invention, a communication device, typically a receiver or a transmitter, has two or more radio frequency (RF) ports for communicating in respective electromagnetic (EM) frequency bands. The communication device may be mounted on a substrate having device interconnection ports in the form of radiative antennas, typically radiation launch pads or patch antennas, respectively connected to the RF ports of the device. A duplexer may be attached to the substrate in such a way as to transfer EM radiation via one of the interconnection ports, and thus via one of the RF ports operative at a selected frequency band.

In some embodiments a transceiver comprises two of the communication devices described above: a transmitter communication device having two or more transmit RF ports, and a receiver communication device having two or more receive RF ports (corresponding in number to the transmit ports). The devices are typically mounted on a substrate. Each transmit port may be connected to a respective transmit interconnection port that is mounted on the substrate, and each receive port may be connected to a respective receive interconnection port mounted on the substrate. Each pair of transmit and receive ports is typically operative at a different frequency band.

To assemble the transceiver, a duplexer is selected from a group of duplexers, the selected duplexer coupling a particular pair of transmit and receive interconnection ports to an antenna. Typically, the coupling to the antenna is via an aperture in the substrate that is common for all the duplexers in the group.

The transceiver is thus configured to operate at a particular frequency band by selection and coupling of a duplexer.

In an alternative embodiment of the present invention, one device interconnection port may be selectably connected to one of a number of RF ports of a communication device. The device and the one interconnection port are typically located on a substrate, and the selection of the RF port may be performed by attaching one of a group of dielectric plates to the substrate. Each dielectric plate comprises a conducting line that connects a selected RF port to the interconnection port. In a further alternative embodiment, rather than locating one device interconnection port on the substrate, each of the dielectric plates in the group is formed with an interconnection port.

In either of the latter embodiments, a particular RF port may be chosen for operation by attachment of a selected dielectric plate to the substrate.

DETAILED DESCRIPTION

Reference is now made to FIGS. 1-4, which are schematic top views of portions of a substrate 20, according to embodiments of the present invention. Substrate 20 acts as a scaffold upon which are mounted elements that are typically configured to form a microwave transceiver 22. In the following description, by way of example, substrate 20 is assumed to comprise a printed circuit board (PCB), and is herein also referred to as PCB 20. PCB 20 typically comprises a solid dielectric sheet, the top and bottom surfaces of which are at least partially covered by a conductor such as copper, so that the PCB is a double-layered PCB. Alternatively, substrate 20 may be configured as a multi-layered PCB, having one or more conducting layers interleaved in the solid dielectric sheet in addition to conductors on the top and bottom surfaces.

Microwave transceiver 22 is assumed to operate within a radio frequency (RF) range between approximately GHz and approximately 40 GHz. However, there is no requirement that transceiver 22 operates within this range, so that embodiments of the present invention may operate at frequencies above or below the range.

Transceiver 22 comprises a transmitter communication device 24 formed as an integrated circuit (IC) mounted on the top surface of PCB 20. In some embodiments transmitter device 24 comprises a modular microwave IC (MMIC). Transmitter 24 is configured to transmit electromagnetic (EM) energy in a selectable one of a number of frequency ranges, herein for simplicity also referred to as transmit frequencies, or just frequencies. Transmitter 24 is, by way of example, assumed to transmit three frequencies designated T1, T2, and T3. The frequency at which the transmitter transmits may typically be selected by an operator or producer of transceiver 22.

The EM energy in the different frequencies is transmitted via separate, generally similar, guided transmission lines 26, 28, 30 from respective output transmit RF ports TP1, TP2, and TP3 of the transmitter. Except where otherwise indicated, in the following description lines 26, 28, 30 and other guided transmission lines referred to herein are assumed, by way of example, to be formed as microstrips on substrate 20, i.e., as conducting lines separated from a conducting ground layer by the dielectric sheet of the substrate, so that lines such as line 26 may also be referred to herein as microstrip 26.

Microstrips 26, 28, 30 respectively terminate at connectors 32, 34, 36. The connectors are configured to accept respective transmit power amplifiers, so that the amplifiers, when installed in the connectors, receive their input EM energy from the microstrips. Microstrips 26, 28, 30 thus act as input lines to the connectors. Connectors 32, 34, 36 also have respective output lines, in the form of microstrips 38, 40, 42, which convey the amplified EM energy output by the power amplifiers to respective transmission interconnection ports 44, 46, 48, herein also referred to as launch pads, at which the output lines terminate.

Launch pads 44, 46, 48 are typically configured as patch antennas that radiate the amplified EM energy received from their microstrips. Typically, dimensions of the pads are selected to optimize the radiation efficiency of the pad for the frequency at which it operates. The location of each of the transmission launch pads on substrate 20 is described below.

Transceiver 22 also comprises a receiver communication device 64, which is formed as an integrated circuit, in some embodiments an MMIC, mounted on the top surface of PCB 20. Receiver 64 is typically configured to receive EM energy at the same number of frequencies as transmitter 24, so that in the example described herein, the receiver receives at a selectable one of three receive frequency ranges R1, R2, R3, corresponding to frequency ranges T1, T2, T3 of the transmitter. For simplicity, the receive frequency ranges are also referred to herein as frequencies. Typically, each pair of frequencies (T1, R1), (T2, R2), and (T3, R3) is different, although in some embodiments, such as, for example, in a time division duplex (TDD) system, the frequencies of each pair may be the same.

Typically, pairs of frequencies (T1, R1), (T2, R2), and (T3, R3) are respectively selected to correspond to industry recognized frequency bands, herein referred to as B1, B2, B3. Table I below illustrates examples of industry recognized frequencies for bands B1, B2, and B3.

TABLE I

| Band | Transmit Range (MHz) | Receive Range (MHz) |
| --- | --- | --- |
| 6 GHz - L; sub band 1 (B1) | 5930.375-6048.975 (T1) | 6182.415-6301.015 (R1) |
| 6 GHz - L; sub band 2 (B2) | 6048.975-6167.575 (T2) | 6301.015-6419.615 (R2) |
| 6 GHz - H; sub band 1 (B3) | 6445-6595 (T3) | 6785-6935 (R3) |

Frequencies R1, R2, R3, are collected at respective receive interconnection ports 74, 76, 78, also referred to herein as receive launch pads, which as for the transmission pads, are typically configured as patch antennas. The dimensions of each receive launch pad are typically also selected to optimize the radiation efficiency of the pad at the frequency (R1, R2, or R3) at which it operates. Launch pads 74, 76, 78 are respectively connected to input RF ports RP1, RP2, and RP3 of receiver 64 by lines 80, 82, 84. The location of each of the receive launch pads is described below.

Substrate 20 comprises a common aperture 86 via which the three transmit and three receive frequencies of transceiver 22 transfer. The aperture is connected by a guided transmission line to an antenna, typically a horn or parabolic dish antenna, which is designed to operate efficiently at the transmit and receive frequencies. For simplicity, the antenna and the transmission line connecting aperture 86 to the antenna are not shown in the figures.

The transmit and receive frequencies of a given frequency band are transferred to and from aperture 86 via a respective duplexer. In transceiver 22 there are separate duplexers 88, 90, 92 for each frequency band. Typically the group of duplexers 88, 90, 92 are formed of transmission lines such as waveguides. The waveguides have appropriate isolators and/or circulators, acting as directional filters, installed to ensure minimal crossover between the transmit and receive signals. For simplicity, the isolators/circulators are not shown in FIGS. 2-4. As illustrated in FIGS. 1-4, the locations of the transmission and receive launch pads on substrate 20 are selected so that each duplexer aligns with a specific pair of pads, and so that an opening of each duplexer aligns with aperture 86.

Thus, duplexer 88 (FIG. 2), which is used for frequency band B3, has an antenna opening 94 aligning with aperture 86, and the antenna opening has dimensions so that it mates with the aperture. In addition, duplexer has a transmit opening 96 aligning with and dimensioned to mate with transmission launch pad 48, and a receive opening 98 aligning with and dimensioned to mate with receive launch pad 78.

Similarly, duplexers 90 and 92 (FIGS. 3 and 4), have respective antenna openings 100, 102 aligning with and dimensioned to mate with aperture 86. Duplexer 90 is used for frequency band B2, and duplexer 92 is used for band B1. Duplexers 90 and 92 have respective transmit openings 104, 106 aligning with and dimensioned to mate with transmission launch pads 46 and 44, and respective receive openings 108, 110 aligning with and dimensioned to mate with receive launch pads 76 and 74.

Figure 2:
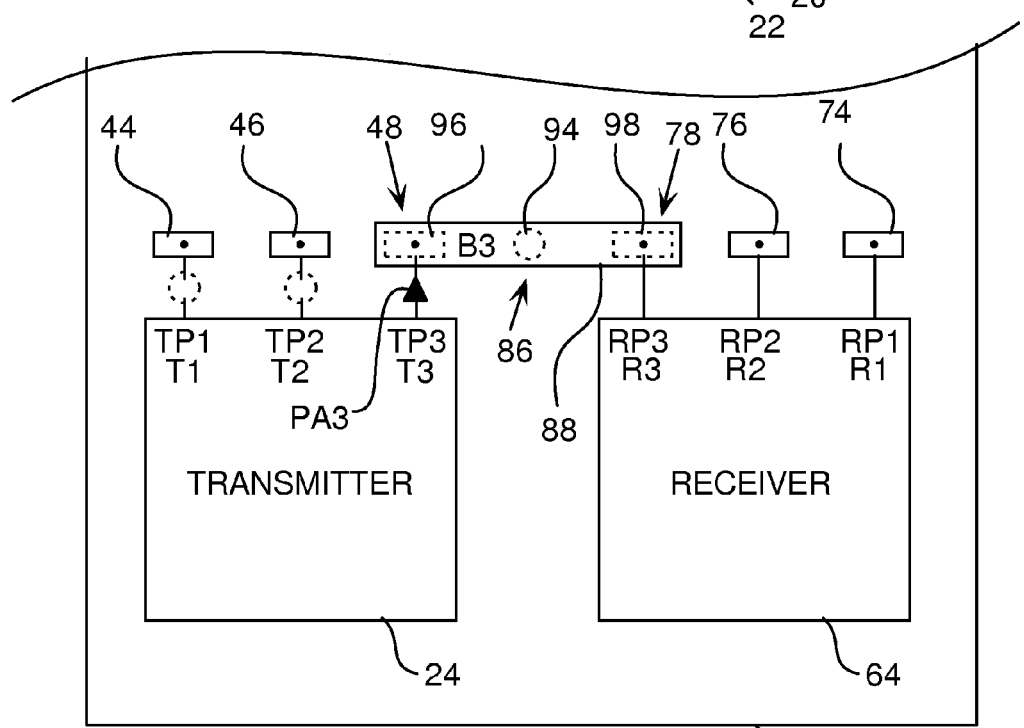
Figure 3:
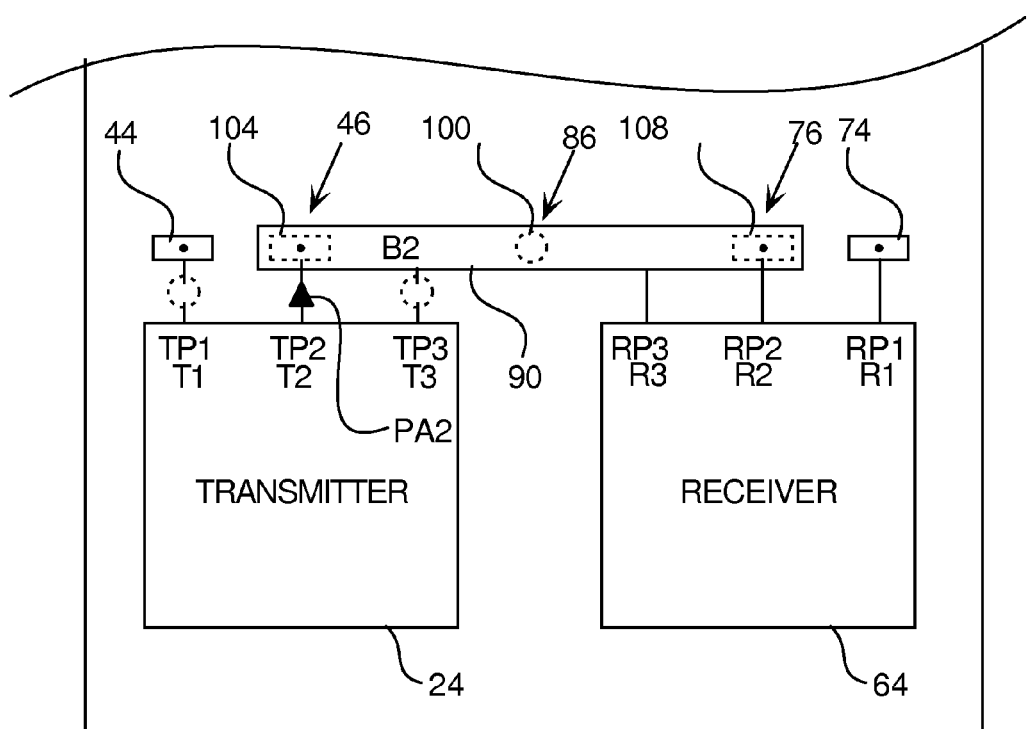
Figure 4:
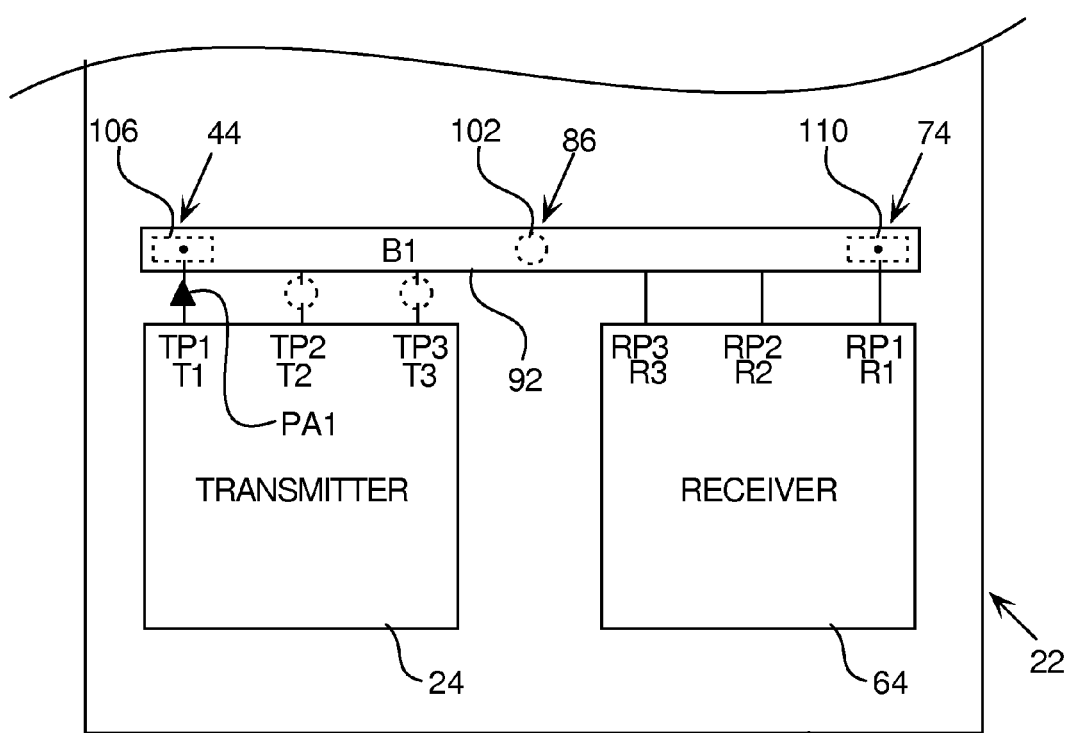

To assemble transceiver 22, an assembler first chooses the frequency band at which the transceiver is to operate, and selects the appropriate duplexer from the group of duplexers 88, 90, and 92. The selected duplexer is attached to substrate 20, as illustrated in FIGS. 2-4. The attachment is typically mechanical, such as is provided by screws and/or spring clips, but may also comprise at least partially attaching by soldering or welding. In addition, an appropriate transmit power amplifier, PA1, PA2, or PA3, is chosen and inserted into one of connectors 32, 34, 36. Alternatively, the power amplifiers may be incorporated into the assembly in any other way known in the art, such as by soldering or attaching by screws. Typically, the selected power amplifier PA1, PA2, or PA3, is specific to the transmit frequency T1, T2, or T3. In some embodiments, one power amplifier may be used for more than one transmit frequency.

FIGS. 5-8 are schematic top views of a portion of a substrate 220 upon which is formed a microwave transceiver 222, according to embodiments of the present invention. The operation of transceiver 222 is generally similar to that of transceiver 22 (FIGS. 1-4), and substrate 220 is substantially similar in properties and function to substrate 20, so that apart from the differences described below, elements indicated by the same reference numerals in both transceivers 22 and 222 are generally similar in construction and in operation.

Transceiver 222 is, like transceiver 22, configured to be operable in one of a number of frequency bands. As for transceiver 22, transceiver 222 is assumed by way of example to be able to operate in one of three different bands B1, B2, or B3, using transmit ports TP1, TP2, TP3, of transmitter 24 and receive ports RP1, RP2, RP3, of receiver 64.

Transceiver 222 is typically configured to be able to operate at any one of bands B1, B2, or B3 by positioning respective duplexers 224A, 224B, or 224C on the transceiver. Duplexers 224A, 224B, and 224C are respectively operative over bands B1, B2, and B3, and typically have the same size. Alternatively, depending on the frequencies of the bands, a single duplexer may operate over two or all three of the bands. In the following description duplexers 224A, 224B, and 224C are also referred to collectively as duplexers 224.

While transceiver 222 comprises substantially similar operational elements to those of transceiver 22, from a conceptual point of view the elements in transceiver 222 may be considered to be repositioned, i.e., located and/or oriented differently, compared to those of transceiver 22. Herein the conceptual repositioning of the elements of transceiver 222 is assumed to be implemented by a counter-clockwise rotation by 90° of transmitter 24 and its coupled elements relative to the position of the transmitter and elements in transceiver 22. The conceptual repositioning of receiver 64 and its coupled elements comprises a clockwise rotation by 90° of receiver 64 and its coupled elements relative to the position of the receiver and elements in transceiver 22, followed by a reflection of the receiver and its coupled elements in a horizontal line of symmetry.

It will be understood that the conceptual repositioning described above is for the purposes of simplifying and clarifying the description of transceiver 222, and that the transceiver is typically implemented as illustrated in FIGS. 5-8, with no actual repositioning of elements of transceiver 22.

In forming substrate 220, distances between launch pads 44 and 74, launch pads 46 and 76, and launch pads 48 and 78, are arranged to be substantially equal. In addition, the launch pads are arranged on substrate 220 so that lines joining the launch pads, shown in FIG. 5 as broken lines 226, 228, and 230, cross at a common intersection. At the common intersection, an aperture 232 is formed in substrate 220, aperture 232 having substantially the same function as aperture 86 of transceiver 22. In some embodiments, launch pads 44 and 74, 46 and 76, and 48 and 78 are aligned so that, as illustrated in FIGS. 5-8, they are approximately orthogonal to their joining lines.

Duplexers 224 function and are constructed generally as duplexers 88, 90, and 92, serving to isolate transmitter 24 and receiver 64 from each other, while allowing each communication device to perform correctly. Duplexers 224 comprise a central antenna opening 234, a transmit opening 236, and a receive opening 238.

To assemble transceiver 222, the frequency band at which the transceiver is to operate is chosen, and an appropriate power amplifier, PA1, PA2, or PA3 is connected into the transceiver, for example, by inserting it into its socket. Duplexer 224A, 224B, or 224C is then positioned so that opening 234 aligns with aperture 232, so that the transmit opening aligns with the transmission launch pad of the chosen frequency band, and so that the receive opening aligns with the band's receive launch pad. Once positioned, duplexer 224A, 224B, or 224C is attached to substrate 220, generally as described above for duplexers 88, 90, and 92.

It will be appreciated that for cases where a single duplexer may be used, assembly of transceiver 222 for the different bands is effectively accomplished by rotating the single duplexer into one of a group of three positions.

FIG. 6 illustrates transceiver 222 assembled to operate in frequency band B1. Amplifier PA1 is inserted into connection 32 and openings 236 and 238 respectively align with pads 44 and 74. FIG. 7 illustrates the transceiver assembled to operate in frequency band B2. Amplifier PA2 is inserted into connection 34; openings 236 and 238 align with pads 46 and 76. FIG. 8 illustrates the transceiver assembled to operate in frequency band B3. Amplifier PA3 is inserted into connection 36 and openings 236 and 238 respectively align with pads 48 and 78.

Figure 9:
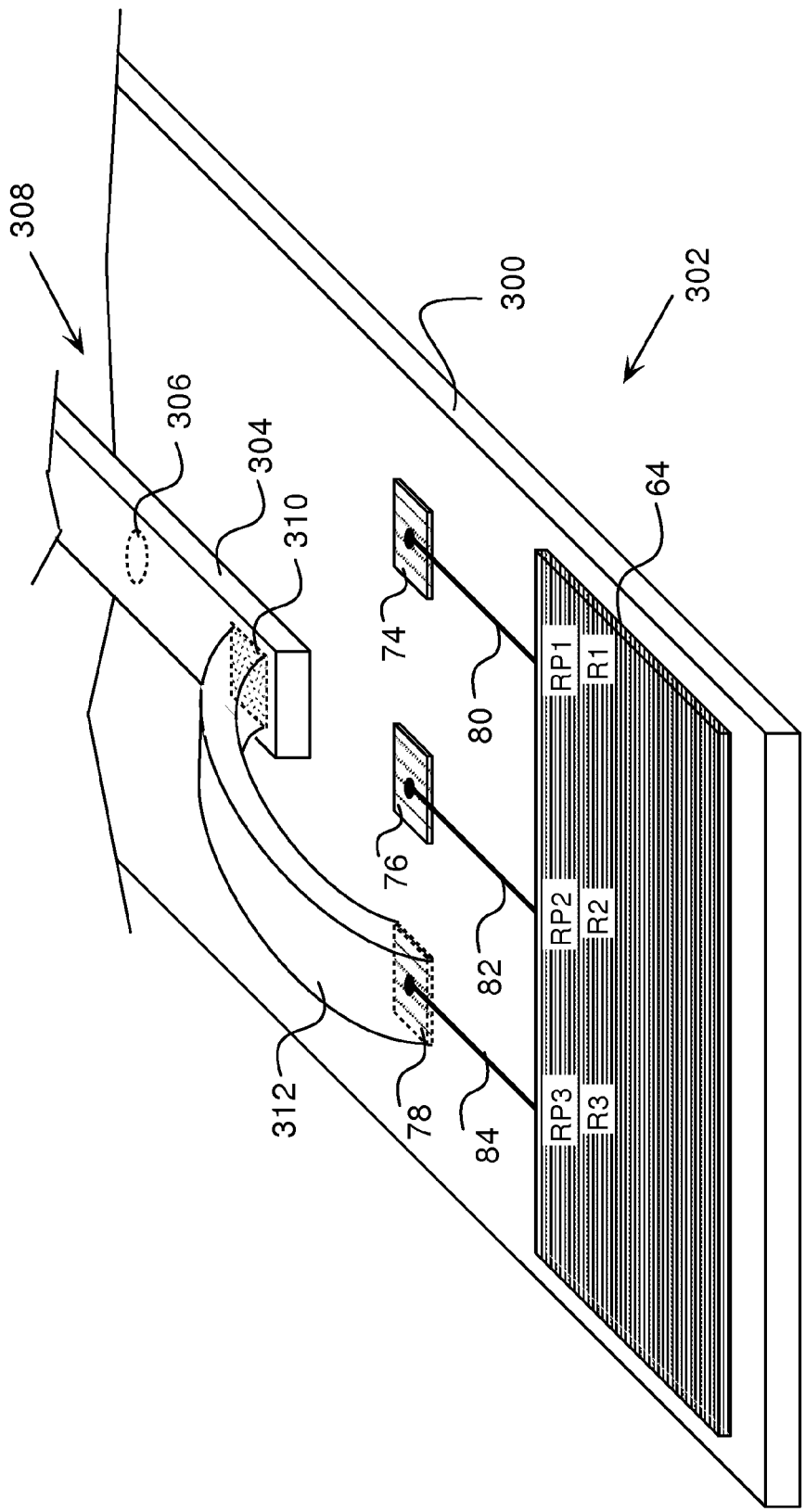
FIG. 9 is a schematic perspective view of a portion of a substrate, according to a further alternative embodiment of the present invention.

FIG. 9 is a schematic perspective view of a portion of a substrate 300 upon which is formed a microwave transceiver 302, according to an embodiment of the present invention. The operation of transceiver 302 is generally similar to that of transceiver 22 (FIGS. 1-4), and substrate 300 is substantially similar in properties and function to substrate 20, so that apart from the differences described below, elements indicated by the same reference numerals in both transceivers 22 and 302 are generally similar in construction and in operation. For simplicity, only a receive portion of transceiver 302 is illustrated in FIG. 9, and those having ordinary skill in the art will be able to use the following description of the receive portion, mutatis mutandis, to implement the transmit portion.

Transceiver 302 comprises a duplexer 304, which is substantially similar in operation and construction to one of duplexers 224 of transceiver 222. (Duplexer 304 is constructed according to the frequency band within which transceiver 302 operates.) Duplexer 304 has an opening 306 which mates and aligns with an aperture 308 in substrate 300. Opening 306 and aperture 308 are substantially similar in function to opening 94 and aperture 86 of transceiver 22.

Duplexer 304 comprises a receive opening 310, which is generally similar to receive opening 238 of duplexers 224. Launch pads 74, 76, and 78 are located and oriented on substrate 300, and receive opening 310 is located and oriented on duplexer 304, so that any of the launch pads may be coupled to the receive opening by a flexible transmission line 312, the line typically comprising a flexible waveguide. Thus, transceiver 302 is assembled by selecting the receive frequency at which the transceiver is to operate, and connecting the appropriate launch pad to the duplexer receive opening with the flexible transmission line. FIG. 9 illustrates the receive portion of transceiver 302 assembled to operate at receive frequency R3.

Figure 10:
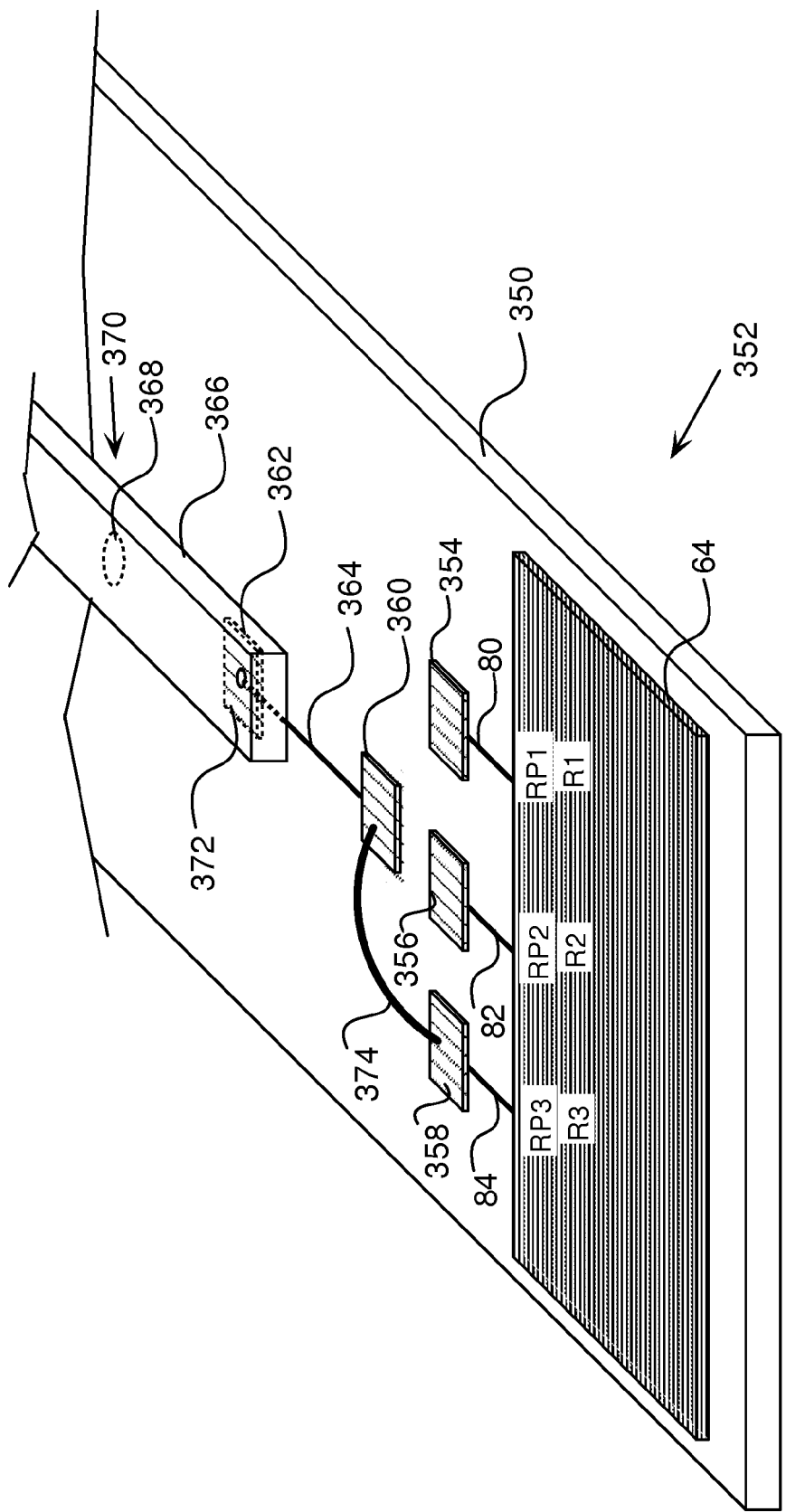
FIG. 10 is a schematic perspective view of a portion of a substrate, according to a yet further embodiment of the present invention.

FIG. 10 is a schematic perspective view of a portion of a substrate 350 upon which is formed a microwave transceiver 352, according to an embodiment of the present invention. The operation of transceiver 352 is generally similar to that of transceiver 22 (FIGS. 1-4), and substrate 350 is substantially similar in properties and function to substrate 20, so that apart from the differences described below, elements indicated by the same reference numerals in both transceivers 22 and 352 are generally similar in construction and in operation. For simplicity, only a receive portion of transceiver 352 is illustrated in FIG. 10, and those having ordinary skill in the art will be able to use the following description of the receive portion, mutatis mutandis, to implement the transmit portion.

In contrast to the transceivers described above, in transceiver 352 receive transmission lines 80, 82, 84 terminate in respective, substantially non-radiating, receive connectors 354, 356, and 358, located on substrate 350, which may comprise any type of RF or microwave connector known in the art. Another substantially non-radiating connector 360 is also located on the substrate in proximity to the receive connectors. Connector 360 is connected to a receive launch pad 362 by a transmission line 364, both the pad and the line being formed on the substrate.

Transceiver 352 comprises a duplexer 366, which is substantially similar in operation and construction to one of duplexers 224 of transceiver 222. (Duplexer 366 is constructed according to the frequency band within which transceiver 352 operates.) Duplexer 366 has an opening 368 which mates and aligns with an aperture 370 in substrate 350. Opening 368 and aperture 370 are substantially similar in function to opening 94 and aperture 86 of transceiver 22.

Duplexer 366 also comprises a receive opening 372 which mates and aligns with receive launch pad 362. Transceiver 352 is assembled by selecting the receive frequency at which the transceiver is to operate, and connecting connector 360 to one of receive connectors 354, 356, or 358. The connection is performed using a flexible transmission line 374, such as a coaxial cable. FIG. 10 illustrates the receive portion of transceiver 352 assembled to operate at receive frequency R3.

Figure 11:
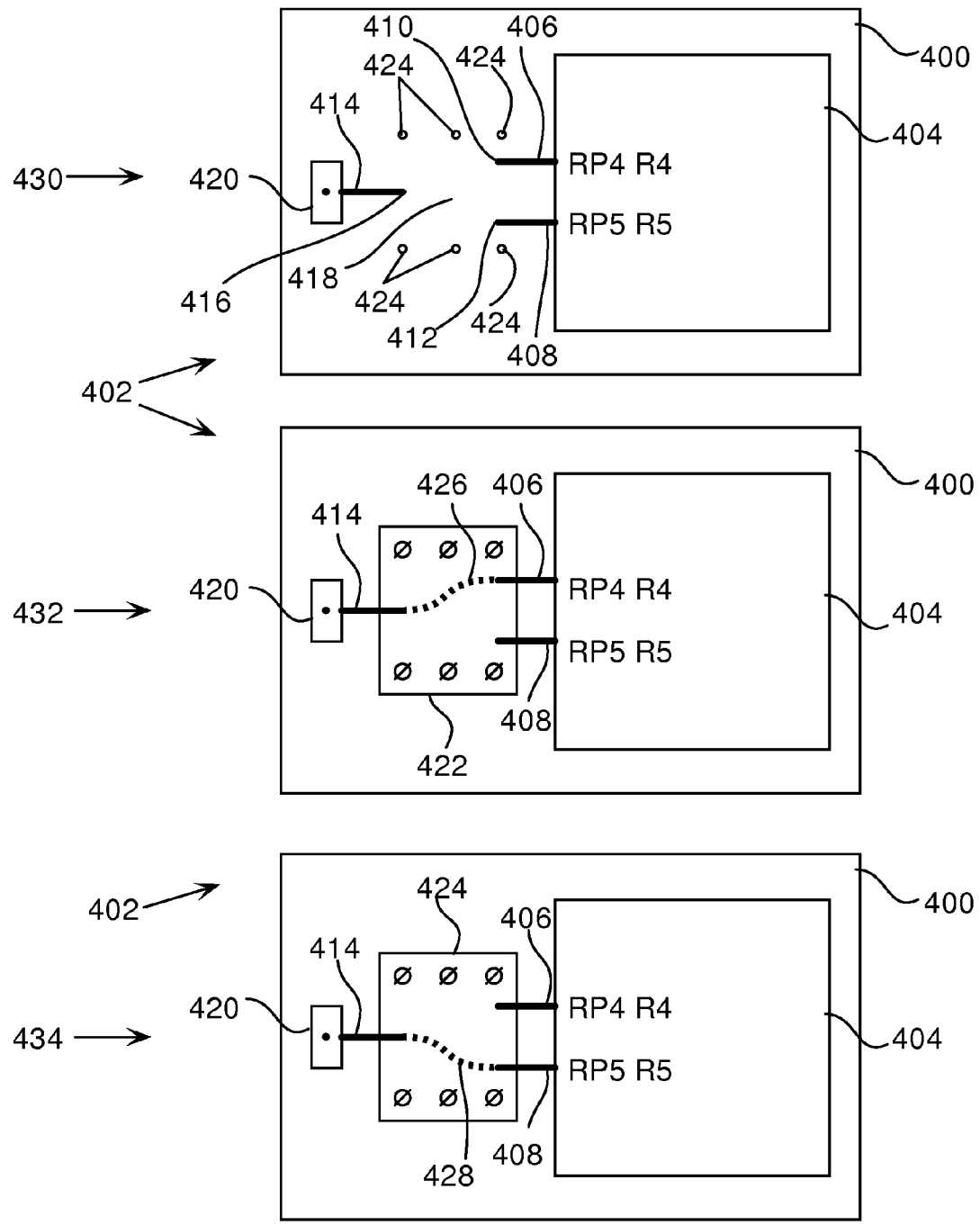
FIG. 11 shows schematic diagrams of top views of a portion of a substrate, according to another embodiment of the present invention.

FIG. 11 shows schematic diagrams of top views of a portion of a substrate 400 upon which is formed a microwave transceiver 402, according to embodiments of the present invention. The operation of transceiver 402 is generally similar to that of transceiver 22 (FIGS. 1-4), and substrate 400 is substantially similar in properties and function to substrate 20. For simplicity, only a receive portion of transceiver 402 is illustrated in FIG. 11, and those having ordinary skill in the art will be able to use the following description of the receive portion, mutatis mutandis, to implement the transmit portion.

As illustrated in a diagram 430, transceiver 402 comprises a receiver communication device 404, which is mounted on substrate 400. Receiver device 404 is generally similar to device 64 (transceiver 22), receiving at a selectable one of two input ports RP4, RP5 respective receive frequencies R4, R5. Ports RP4, RP5, receive their EM energy from first and second microstrip lines 406, 408. By way of example the lines are assumed to be formed as substantially parallel equidistant line segments on the upper surface of substrate 400, and have respective terminations 410, 412.

A third microstrip line 414, parallel to lines 406, 408, is formed on the upper surface of the substrate. By way of example line 414 is assumed to be located so as to be symmetrical with respect to lines 406, 408, and is configured to have a first termination 416 so that there is a region 418 on substrate 400 where there is no microstrip line between termination 416 and terminations 410, 412. Microstrip line 414 has as its second termination a receive launch pad 420 located on substrate 400.

For transceiver 402 to operate at frequency R4, a receive plate 422 is attached to substrate 400, as is illustrated in a diagram 432; for the transceiver to operate at frequency R5, a receive plate 424 is attached to the substrate, as is illustrated in a diagram 434. Both receive plates are formed of solid dielectric sheets, and either plate may be attached by screwing into mating holes 424 in the substrate. Plate 422 has on its lower surface an intermediate conducting line 426 that couples microstrip lines 406 and 414. Plate 424 has on its lower surface an intermediate conducting line 428 that couples microstrip line 408 to line 414. When the plates are attached to substrate 400, intermediate conducting lines 426 and 428 form microstrip lines with the ground plane of substrate 400.

The coupling between each intermediate conducting line and its two microstrip lines may be capacitive or galvanic, neither of which methods require soldering. Thus, intermediate line 426 of plate 422 may be capacitively coupled to lines 406 and 414 by arranging the intermediate line to terminate close to, without contacting, terminations 410 and 416. Alternatively, intermediate line 426 may be galvanically coupled to lines 406 and 414 by arranging the terminations of the intermediate line to overlap and contact terminations 410 and 416. The galvanic coupling may be ensured by applying, before the plate having the intermediate line is attached to the substrate, a pressure reactive conducting material to the terminations of the line. Such a material is PARIPOSER® CONTACTOR, produced by Paricon Technologies Corporation of Fall River, Mass. In some embodiments one end of the intermediate line is coupled galvanically and the other end is coupled capacitively.

Transceiver 402 has a transmit portion that is generally similar to the receive portion of the transceiver but that also incorporates a power amplifier. Alternatively, the transmit portion may be generally similar to one of the transmit portions of transceivers described in FIGS. 1-10. The transmit portion of transceiver 402 terminates in a transmit launch pad, similar to receive launch pad 420.

Transceiver 402 is assembled by selecting a desired receive frequency, R4 or R5, and attaching the appropriate receive plate 422 or 424 to the substrate. A transmit frequency is also selected for the transmit portion. A duplexer, generally similar to one of the duplexers described in FIGS. 1-10, couples the receive launch pad and the transmit launch pad.

It will be understood that the geometrical descriptions of microstrip lines 406, 408, and 414 above are by way of example. Thus, other configurations of the lines, which will be apparent to those having ordinary skill in the art, wherein the lines may be coupled by plates 422 or 424, are included within the scope of the present invention.

Figure 12:
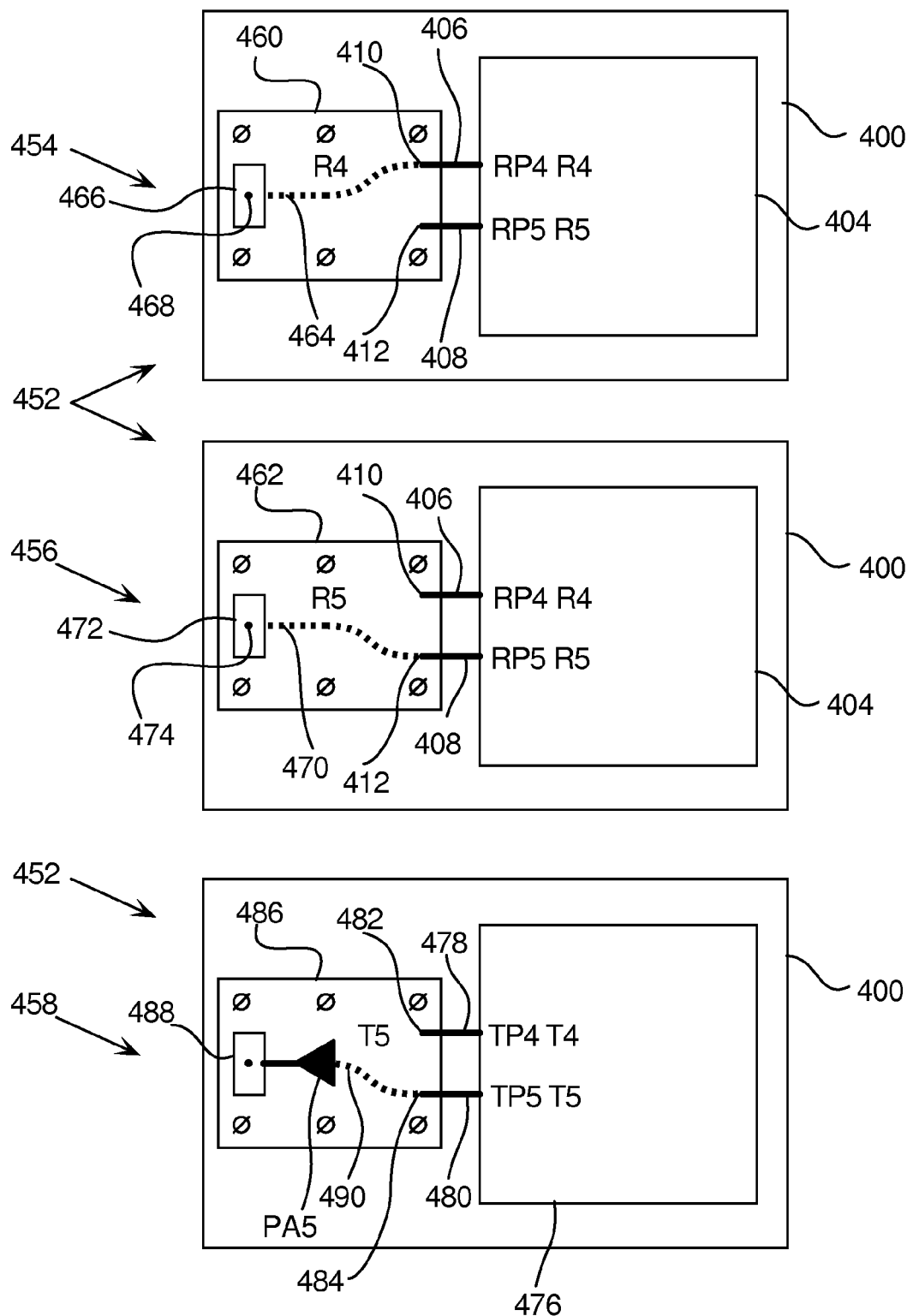
FIG. 12 shows schematic diagrams of top views of portions of a microwave transceiver, according to an embodiment of the present invention.

FIG. 12 shows schematic diagrams of top views of portions of a microwave transceiver 452, according to embodiments of the present invention. Apart from the differences described below, the operation of transceiver 452 is generally similar to that of transceiver 402 (FIG. 11), and elements indicated by the same reference numerals in both transceivers 402 and 452 are generally similar in construction and in operation. Diagrams 454 and 456 illustrate alternative views of a receive portion of transceiver 452, and a diagram 458 illustrates a view of a transmit portion of the transceiver. The transceiver is assumed to be formed on substrate 400.

In the receive portion of transceiver 452, in contrast to transceiver 402, receive launch pad 420 and connecting line 414 are not formed on substrate 400. Instead, one of an R4 receive plate 460 or an R5 receive plate 462 is used to provide a coupling between receiver port RP4 or RP5 and a launch pad, and the launch pads are formed on the plates. Plates 460 and 462 have generally similar construction to plates 422 and 424, being formed of a solid dielectric sheet which may be attached to substrate 400 by screwing into mating holes of the substrate.

Thus, R4 receive plate 460 has on its lower surface an intermediate conducting line 464 that couples microstrip 406 to a receive launch pad 466 formed on the upper surface of the plate. Line 464 and pad 466 are typically connected by a via 468. R5 receive plate 462 has on its lower surface an intermediate conducting line 470 that couples line 408 to a receive launch pad 472 formed on the upper surface of the plate. Line 470 and pad 472 are typically connected by a via 474. In some embodiments launch pads 466 and 472 have substantially similar dimensions; alternatively the dimensions of the launch pads may be different, being respectively optimized for frequencies R4 and R5.

The coupling between lines 464 and 406 (diagram 454) and between lines 470 and 408 (diagram 456) may be capacitive or galvanic, and is typically as described above with reference to transceiver 402 (FIG. 11).

As illustrated in diagram 458, transceiver 452 comprises a transmitter communication device 476, which is mounted on substrate 400. Transmitter device 476 is generally similar to device 24 (transceiver 22), transmitting at a selectable one of two output ports TP4, TP5 respective transmit frequencies T4, T5 via first and second microstrips 478, 480. The microstrips are formed as line segments on the upper surface of substrate 400, and have respective terminations 482, 484.

A T5 transmit plate 486 has a generally similar construction as plates 460 and 462, being formed of a solid dielectric sheet which may be attached to substrate 400 by screwing into mating holes of the substrate. As described hereinbelow, T5 transmit plate 486 is configured to use port TP5 at frequency T5. Transmit plate 486 has a T5 transmit launch pad 488 formed on the upper surface of the plate. The launch pad receives its transmit EM energy from the output of a power amplifier PA5, which is typically mounted on the upper surface of the transmit plate. An intermediate conducting line 490, formed on the lower surface of transmit plate 486, couples EM energy input to amplifier PA5 from microstrip 480. In some embodiments there may be a via connecting a termination of line 490 to an input of amplifier PA5. When the transmit plate is attached to substrate 400, intermediate conducting line 490 forms a microstrip with the ground plane of substrate 400.

A T4 transmit plate (not shown in FIG. 12 for simplicity) is generally similar in construction and operation to T5 transmit plate 486. However, the T4 transmit plate couples EM energy at frequency T4 from port TP4, via line 478, termination 482, and an intermediate conducting line on the lower surface of the T4 plate, to an input of a power amplifier PA4, and from an output of the amplifier to a T4 transmit launch pad. Depending on frequencies T4 and T5, the power amplifier for the T4 transmit plate may be the same as amplifier PA5, or the two power amplifiers PA4, PA5, may be different, being optimized for operation at the different frequencies. Similarly, depending on the frequencies, the dimensions of the T4 launch pad and the T5 launch pad may be substantially similar, or may be different, being optimized for the different frequencies.

The coupling from terminations 482 or 484 to their respective intermediate conducting lines may be capacitive or galvanic, as described above.

Transceiver 452 is assembled by selecting a desired receive frequency, R4 or R5, and attaching the appropriate receive plate 460 or 462 to the substrate. A transmit frequency T4 or T5 is also selected for the transmit portion, and the appropriate T4 transmit plate or T5 transmit plate, with amplifier PA4 or PA5, is attached to the substrate. A duplexer, generally similar to one of the duplexers described in FIGS. 1-10, couples the receive launch pad and the transmit launch pad.

It will be appreciated that the embodiments described above are cited by way of example, and that the present invention is not limited to what has been particularly shown and described hereinabove. For example, three plates similar to plates 422, 424 (FIG. 11) may be used for a receive portion of transceiver 20 (FIGS. 1-4), so that transceiver 20 may use one receive launch pad. Similarly a transmit portion of transceiver may use one of three plates generally similar to plates 422 or 424, the transmit portion also incorporating a power amplifier, so that the transceiver may use one launch pad. Thus, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An apparatus, comprising:
a communication device comprising first and second ports for communicating in a first frequency band, and third and fourth ports for communicating in a second frequency band;
a substrate comprising an aperture communicatively coupled to an antenna, and first, second, third, and fourth interconnection pads respectively connected to the first, the second, the third, and the fourth ports of the communication device; and
a duplexer comprising first and second openings, wherein the duplexer is configured to:
rotate about the aperture to rotatably connect the first and the second openings with the first and the second interconnection pads, respectively;
rotate about the aperture to disconnect the first and the second openings from the first and the second interconnection pads, respectively, and to connect the first and the second openings to the third and the fourth interconnection pads, respectively.

2. The apparatus according to claim 1, wherein the communication device comprises a transmitter integrated circuit connected to the antenna via the first opening.

3. The apparatus according to claim 2, wherein the communication device further comprises a receiver integrated circuit connected to the antenna via the second opening.

4. The apparatus according to claim 1, wherein the duplexer comprises a single duplexer.

5. The apparatus according to claim 1, wherein the first, the second, the third, and the fourth interconnection pads are non-radiative.

6. The apparatus according to claim 1, wherein the first, the second, the third, and the fourth interconnection pads are configured as antennas.

7. The apparatus according to claim 1, further comprising a dielectric plate, having a conducting line, which is attached to the substrate and configured to couple one of the first and the second interconnection pads to a selected one of: the first port, or the second port.

8. The apparatus according to claim 7, wherein the conducting line is configured to couple capacitively.

9. The apparatus according to claim 7, wherein the conducting line is configured to couple galvanically using a pressure reactive conducting material.

10. The apparatus of claim 1, wherein the aperture is substantially symmetrically disposed between the first and the third interconnection pads.

11. The apparatus of claim 1, wherein the duplexer further comprises a second aperture configured to mate with the aperture.

12. The apparatus of claim 11, wherein the second aperture is substantially symmetrically disposed between the first and the second openings.

13. The apparatus of claim 11, wherein the second aperture is substantially centrally located on the duplexer.

14. A method, comprising:
providing a communication device comprising an antenna, first and second ports for communicating in a first frequency band, and third and fourth ports for communicating in a second frequency band, the communication device being disposed on a substrate;
respectively connecting first, second, third, and fourth interconnection pads to the first, second, third, and fourth ports of the communication device; and
connecting a duplexer operative in the first and the second frequency bands to the substrate in a manner to allow the duplexer to be:
rotated about the substrate to couple the duplexer to the first and the second interconnection pads;
rotated about the substrate to decouple the duplexer from the first and the second interconnection pads; and
rotated about the substrate to couple the duplexer to the third and the fourth interconnection pads.

15. The method according to claim 14, wherein the connecting comprises: coupling a transmitter integrated circuit to the antenna via the duplexer.

16. The method according to claim 15, wherein the connecting further comprises: coupling a receiver integrated circuit to the antenna via the duplexer.

17. The method according to claim 14, wherein the coupling of the duplexer to the first and the second interconnection pads comprises: coupling first and second openings of the duplexer with the first and the second interconnection pads, respectively, and wherein the coupling of the duplexer to the third and the fourth interconnection pads comprises: coupling the first and the second openings of the duplexer with the third and the fourth interconnection pads, respectively.

18. The method according to claim 17, wherein the first and the second openings include dimensions selected in response to the first and the second frequency bands.

19. The method according to claim 14, wherein the duplexer includes dimensions selected in response to locations of the first, the second, the third, and the fourth interconnection pads with respect to the substrate.

20. The method according to claim 14, wherein the first, the second, the third, and the fourth interconnection pads are disposed on the substrate.

21. The method according to claim 14, wherein the first, the second, the third, and the fourth interconnection pads are non-radiative.

22. The method according to claim 14, wherein the first, the second, the third, and the fourth interconnection pads are configured as antennas.

23. The method according to claim 14, further comprising: selecting a dielectric plate including a conductive line from a group of dielectric plates comprising respective conducting lines to couple one of the first and the second interconnection pads to a selected one of: the first port, or the second port.

24. The method according to claim 23, wherein the conducting line is configured to couple capacitively.

25. The method according to claim 23, wherein the conducting line is configured to couple galvanically using a pressure reactive conducting material.

26. A communication device, comprising:
a substrate including an aperture communicatively coupled to an antenna;
a transmitter disposed on the substrate, and communicatively coupled to first and second communication pads;
a receiver disposed on the substrate, and communicatively coupled to third and fourth communication pads;
a duplexer including first and second openings, and configured to:
rotate about the aperture to connect the first and the second openings to the first and the third communication pads, respectively; and
rotate about the aperture to disconnect the first and the second openings from the first and the third communication pads, respectively, and to connect the first and the second openings to the second and the fourth communication pads, respectively.

27. The communication device of claim 26, wherein the aperture is substantially symmetrically disposed between the first and the third communication pads.

28. The communication device of claim 26, wherein the duplexer further comprises a second aperture configured to mate with the aperture.

29. The communication device of claim 28, wherein the second aperture is substantially symmetrically disposed between the first and the second openings.

30. The communication device of claim 28, wherein the second aperture is substantially centrally located on the duplexer.

* * * * *